(12) United States Patent
Matsugai

(10) Patent No.: US 10,854,667 B2
(45) Date of Patent: *Dec. 1, 2020

(54) SOLID-STATE IMAGING DEVICE, MANUFACTURING METHOD OF SOLID-STATE IMAGING ELEMENT, AND IMAGING APPARATUS

(71) Applicant: SONY CORPORATION, Tokyo (JP)

(72) Inventor: Hiroyasu Matsugai, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/430,218

(22) Filed: Jun. 3, 2019

(65) Prior Publication Data

US 2019/0355780 A1   Nov. 21, 2019

Related U.S. Application Data

(63) Continuation of application No. 15/802,220, filed on Nov. 2, 2017, now Pat. No. 10,355,042, which is a continuation of application No. 15/311,362, filed as application No. PCT/JP2015/002805 on Jun. 3, 2015, now Pat. No. 9,842,879.

(30) Foreign Application Priority Data

Jun. 12, 2014   (JP) .................................. 2014-121289

(51) Int. Cl.
*H01L 27/146*   (2006.01)

(52) U.S. Cl.
CPC .... *H01L 27/14687* (2013.01); *H01L 27/1464* (2013.01); *H01L 27/14618* (2013.01); *H01L 27/14621* (2013.01); *H01L 27/14627* (2013.01); *H01L 27/14632* (2013.01); *H01L 27/14634* (2013.01); *H01L 27/14645* (2013.01)

(58) Field of Classification Search
None
See application file for complete search history.

(56) References Cited

U.S. PATENT DOCUMENTS

| 9,842,879 | B2 | 12/2017 | Matsugai |
| 2006/0042677 | A1 | 3/2006 | Fukunaga et al. |
| 2006/0051887 | A1 | 3/2006 | Yamamoto et al. |
| 2008/0286939 | A1 | 11/2008 | Ohnuma |
| 2012/0248580 | A1 | 10/2012 | Matsugai et al. |
| 2012/0256284 | A1 | 10/2012 | Yukawa et al. |
| 2013/0029438 | A1 | 1/2013 | Takai et al. |
| 2013/0032914 | A1 | 2/2013 | Iwasaki et al. |

(Continued)

FOREIGN PATENT DOCUMENTS

JP   2009-164314   7/2009

OTHER PUBLICATIONS

Park, Jae-Hyun, et al., "A Warpage of Wafer Level Bonding for CIS (CMOS Image Sensor) Device Using Polymer Adhesive," International Conference on Electronic Packaging Technology & High Density Packaging, 2009, 4 pages.

*Primary Examiner* — Erik Kielin
(74) *Attorney, Agent, or Firm* — Sheridan Ross P.C.

(57) ABSTRACT

There is provided solid-state imaging devices and methods of forming the same, the solid-state imaging devices including: a semiconductor substrate; a glass substrate; an adhesion layer provided between the semiconductor substrate and the glass substrate; and a warpage correction film provided adjacent to one of the semiconductor substrate and the glass substrate.

20 Claims, 9 Drawing Sheets

(56) References Cited

U.S. PATENT DOCUMENTS

2013/0038764 A1 2/2013 Takachi et al.
2013/0181313 A1 7/2013 Nagata et al.
2015/0035554 A1 2/2015 Dang et al.

SOLID-STATE IMAGING DEVICE, MANUFACTURING METHOD OF SOLID-STATE IMAGING ELEMENT, AND IMAGING APPARATUS

CROSS REFERENCE TO RELATED APPLICATIONS

This application is a continuation of U.S. patent application Ser. No. 15/802,220, filed Nov. 2, 2017, which is a continuation of U.S. patent application Ser. No. 15/311,362, filed Nov. 15, 2016, now U.S. Pat. No. 9,842,879, which is a national stage application under 35 U.S.C. 371 and claims the benefit of PCT Application No. PCT/JP2015/002805 having an international filing date of Jun. 3, 2015, which designated the United States, which PCT application claims the benefit of Japanese Priority Patent Application JP 2014-121289 filed Jun. 12, 2014, the entire contents of which are incorporated herein by reference.

TECHNICAL FIELD

The present disclosure relates to a solid-state imaging device, a manufacturing method of the solid-state imaging device, and an imaging apparatus, and particularly to a solid-state imaging device, a manufacturing method of the solid-state imaging device, and an imaging apparatus that, while meeting requirements of miniaturization, can suppress warpage that is generated by bonding substrates.

BACKGROUND ART

A wafer level chip size package (WCSP) in which a semiconductor device is downsized up to the chip size is known. In addition, a structure in which a glass substrate is bonded to a semiconductor substrate via an adhesion layer is disclosed in PTL 1.

CITATION LIST

Patent Literature

PTL 1: Japanese Unexamined Patent Application Publication No. 2009-164314

SUMMARY OF INVENTION

Technical Problem

However, if substrates with thermal expansion coefficients of which are different from each other are heat-bonded to an adhesion layer, and thereafter temperature of the substrates returns to room temperature, warpage is generated. PTL 1 discloses a technology that reduces warpage of a substrate in which a glass substrate is bonded to a surface side of a semiconductor substrate via an adhesion layer; however, it is difficult to meet requirements of miniaturization in terms of the structure. For this reason, there are requirements for suppressing warpage that is generated by bonding the substrates, while meeting the requirements of miniaturization.

It is desirable to meet requirements of miniaturization and to suppress warpage that is generated by bonding substrates.

Solution to Problem

According to an embodiment of the present disclosure, there is provided a solid-state imaging device, including: a semiconductor substrate; a glass substrate; an adhesion layer provided between the semiconductor substrate and the glass substrate; and a warpage correction film provided adjacent to one of the semiconductor substrate and the glass substrate. According to an additional embodiment of the present disclosure, there is provided a method of manufacturing a solid-state imaging device, including: bonding a semiconductor substrate to a glass substrate, where an adhesion layer is provided between the semiconductor substrate and the glass substrate, and where a warpage correction film is provided adjacent to one of the semiconductor substrate and the glass substrate.

Advantageous Effects of Invention

According to the first to third embodiments of the present technology, it is possible to meet requirements of miniaturization and to suppress warpage that is generated by bonding substrates.

The effects described herein are not limited, and may be all effects described in the present specification.

DESCRIPTION OF EMBODIMENTS

Hereinafter, various embodiments of the present technology will be described with reference to the drawings. The description will be made in the following sequence.

1. Concept of Warpage Correction Applying Present Technology
2. Construction Example of Solid-State Imaging Device
3. Manufacturing Method of Solid-State Imaging Device
4. Configuration of Imaging Apparatus <1. Concept of Warpage Correction Applying Present Technology>

Figure 1:
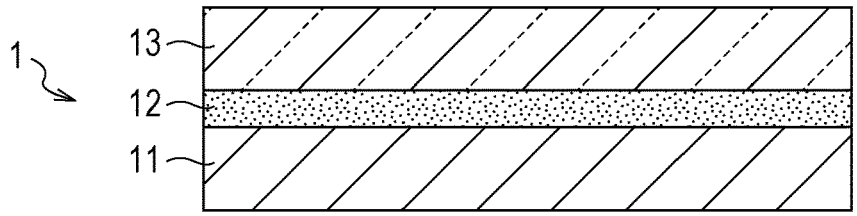
FIG. 1 is an illustrative view showing a structure of a bonded substrate when a warpage correction is not performed.

(Structure of Bonded Substrate When Warpage Correction is not Performed) FIG. 1 is a view illustrating a structure of a bonded substrate when a warpage correction to which the present technology is applied is not performed.

A solid-state imaging device 1 in FIG. 1 is configured by bonding two substrates of a semiconductor substrate 11 and a glass substrate 13, via an adhesion layer 12. The semiconductor substrate 11 is a silicon substrate that is configured with, for example silicon (Si). Here, for example, when a thermal expansion coefficient of the semi-conductor substrate 11 is 3 ppm/degrees Celsius and a thermal expansion coefficient of the glass substrate 13 is 3 ppm/degrees Celsius to 8 ppm/degrees Celsius, if the semi-conductor substrate 11 and the glass substrate 13, which have different thermal expansion coefficients from each other, are heat-bonded together by the adhesion layer 12, warpage is generated when temperatures of the semiconductor substrate 11 and the glass substrate 13 return to room temperature.

Here, in the PTL 1 described above, a technology that reduces warpage by providing the glass substrate 13 with a thickness of 1 mm to 3 mm is disclosed, but since it is necessary to provide the glass substrate 13 with a thickness of 1 mm or more, it is difficult to provide the solid-state imaging device 1 with a thickness of 1 mm or less, and thus it is difficult to meet requirements of miniaturization of the solid-state imaging device 1. That is, it may be preferable that the thickness of the glass substrate 13 is thinner, but in the structure disclosed in PTL 1, the glass substrate 13 demands a thickness necessary for reducing the warpage.

In addition, PTL 1 discloses that an entire thickness is not a problem, if an amount of warpage of the substrate that is formed by bonding the semiconductor substrate 11 and the glass substrate 13 together is suppressed to 2 mm or less. However, actually, the warpage is added even by thermal expansion or stress of the adhesion layer 12 to be selected, and thus adsorption failure to a spin chuck occurs, or characteristic failure caused by chip distortion due to stress on a silicon device surface occurs.

Figure 2:
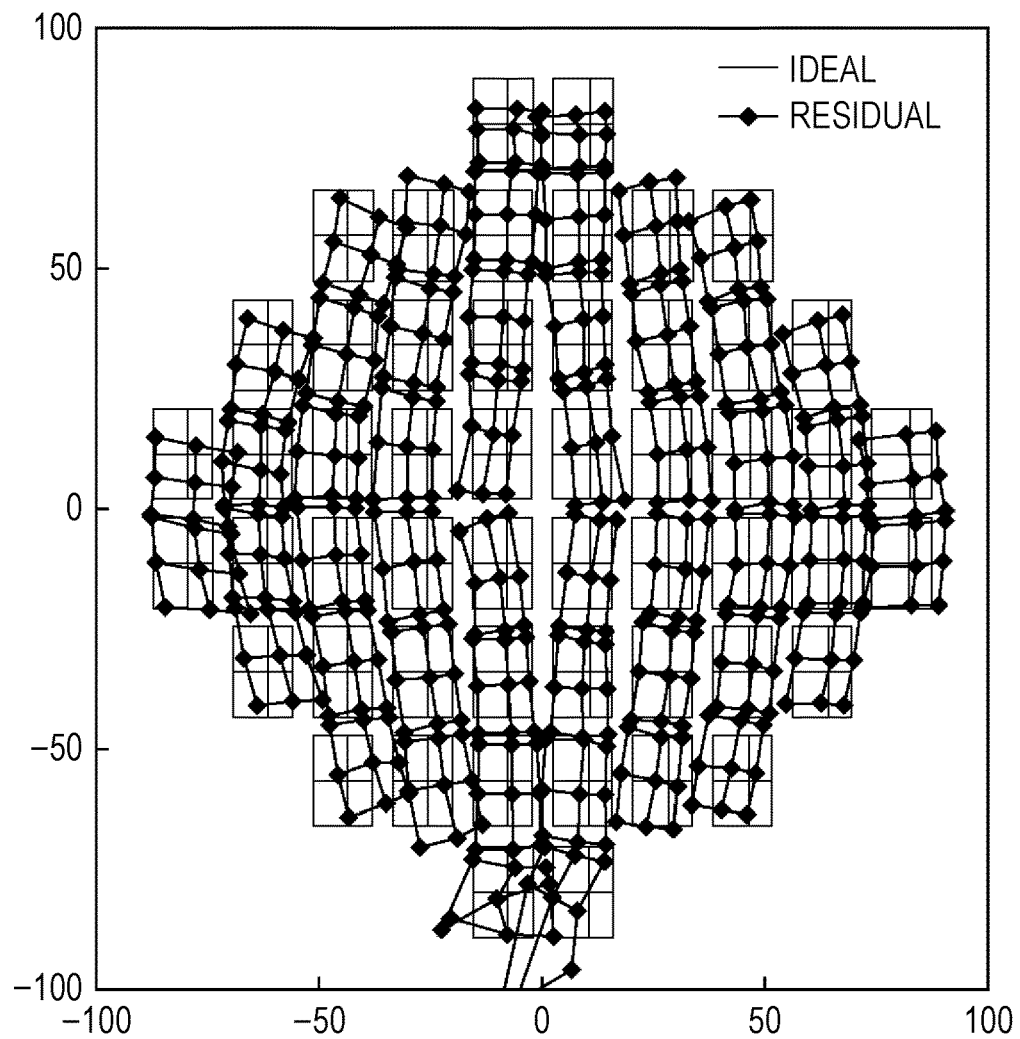
FIG. 2 is an illustrative view schematically showing distortion of a chip.

As illustrated in FIG. 2, when the semiconductor substrate 11 is bonded to the glass substrate 13 via the adhesion layer 12, a phenomenon occurs in which the semiconductor substrate 11 is pulled to the glass substrate 13, thereby being deformed. In FIG. 2, lines denoted by "Ideal" illustrate an ideal chip shape, but since the semiconductor substrate 11 is pulled to the glass substrate 13 thereby being deformed, as illustrated by lines denoted by "Residual", apexes of each rectangle are shifted to positions of black points and thereby the shape becomes a deformed shape.

In order to suppress the distortion caused by bonding the glass substrate 13, it is effective to reduce a thickness of the glass substrate 13. Here, in PTL 1, a structure in which the semiconductor substrate 11 has a thickness of 50 micrometer to 300 micrometer, and the glass substrate 13 has a thickness of 1 mm to 3 mm, is disclosed, since it is necessary to provide the glass substrate 13 with a thickness of 1 mm or more, an influence of the distortion caused by bonding the glass substrate 13 becomes great.

As described above, when the structure of the substrate (bonded substrate) in FIG. 1 is employed, in order to suppress the warpage that is generated on the bonded substrate, it is difficult to meet requirements of miniaturization in terms of the structure. For this reason, there are requirements for suppressing the warpage that is generated by bonding the substrates, while meeting the requirements of miniaturization.

(Structure of Bonded Substrate when Warpage Correction is Performed)

Figure 3:
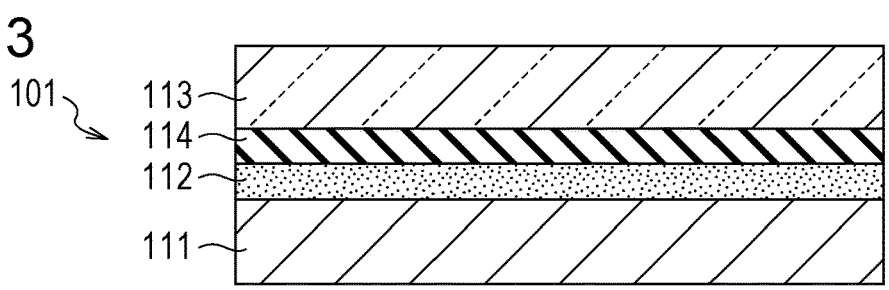
FIG. 3 is an illustrative view showing a structure of a bonded substrate when a warpage correction is performed.

FIG. 3 is a view illustrating a structure of a bonded substrate when a warpage correction to which the preset technology is applied is performed.

In FIG. 3, a solid-state imaging device 101 is configured by bonding a semiconductor substrate 111 to a glass substrate 113 via an adhesion layer 112, but a warpage correction film 114 is provided between the adhesion layer 112 and the glass substrate 113.

The semiconductor substrate 111 is a silicon substrate that is configured with, for example, silicon (Si). The semiconductor substrate 111 is not limited to the silicon semiconductor substrate, and may be configured with a single element such as germanium, or may be a compound semiconductor that is configured with gallium arsenide or indium phosphorus. In the semiconductor substrate 111, a pixel area in which pixel units that perform a photoelectric conversion are two-dimensionally arranged, a control circuit that performs a control of the pixel unit, or the like is formed. The glass substrate 113 is a transparent insulating substrate that is formed on an upper side of the semiconductor substrate 111.

The warpage correction film 114 is a layer for correcting the warpage of the substrate (bonded substrate) which is formed by bonding the semiconductor substrate 111 to the glass substrate 113. In order to correct the warpage, which is generated after the substrates are heat-bonded, of a surface or a rear surface of the semiconductor substrate 111 or the glass substrate 113, the warpage correction film 114 is formed as a film in which at least one of a thermal expansion coefficient and stress with regard to the semiconductor substrate 111, the adhesion layer 112, and the glass substrate 113 is optimized.

Figure 4A:
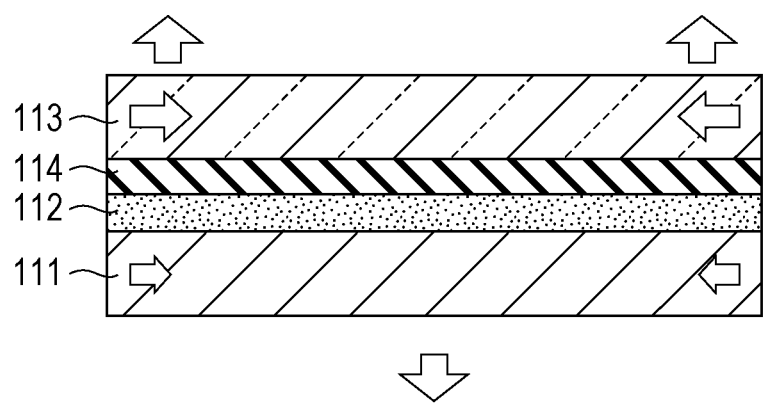
FIGS. 4A and 4B are illustrative views showing a warpage correction caused by a warpage correction film.
Figure 4B:
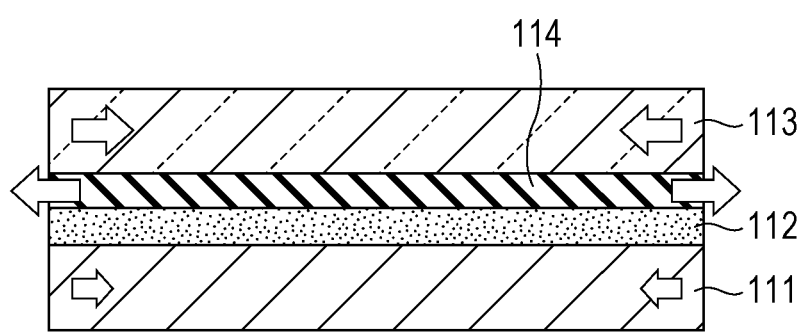

That is, in order to correct the warpage which is generated after the heat-bonding, physical property values, such as a thermal expansion coefficient, an elastic modulus, a thickness, and the like of each substrate are used. As illustrated in FIGS. 4A and 4B, amounts of shrinkage of the semiconductor substrate 111 and the glass substrate 113 are different from each other because thermal expansion coefficients thereof are different from each other, and thereby the warpage is generated after the heat-bonding. Accordingly, the warpage is corrected by forming the warpage correction film 114.

The warpage correction film 114 is configured with, for example, an SiO2 film, a TEOS film, an SiN film, an SiCO film, or an SiC film, and in addition to this, an SOG or an organic film (for example, acrylic or epoxy), or the like. In addition, in order to radiate light onto a pixel area that is formed in the semiconductor substrate 111, the warpage correction film 114 is formed as a transparent film.

Figure 5:
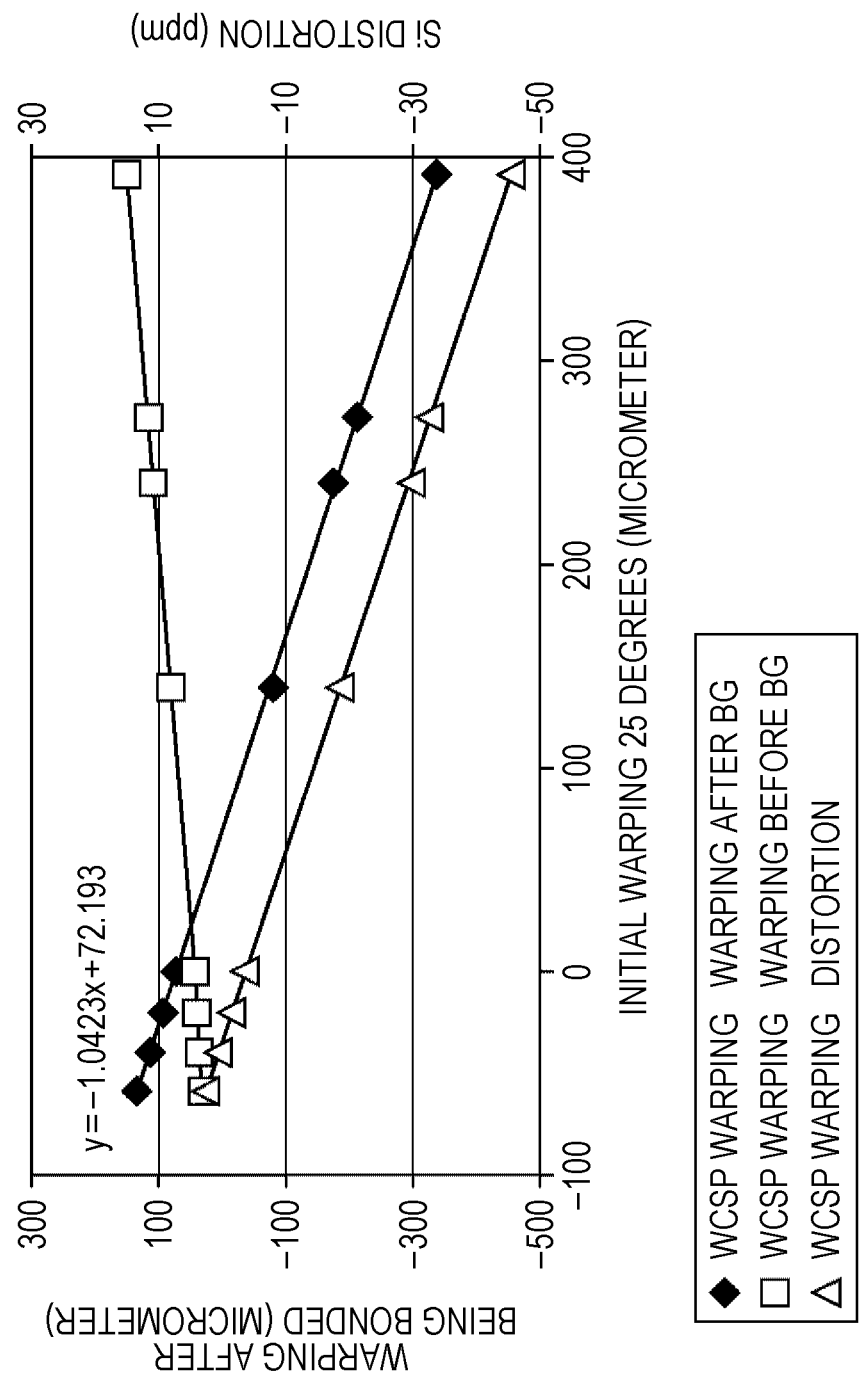
FIG. 5 is an illustrative diagram showing a simulation result for forming an optimized warpage correction film.

Here, a method of forming an optimized warpage correction film 114 will be described. FIG. 5 is a diagram illustrating a simulation result for forming the optimized warpage correction film 114.

In FIG. 5, a horizontal axis denotes an amount of warpage (unit: micrometer) of the semiconductor substrate 111, and a right side of the figure indicates a larger value than a left side. In addition, a vertical axis on the left side denotes an amount of warpage (unit: micrometer) of the substrate (bonded substrate) that is formed by bonding the semiconductor substrate 111 to the glass substrate 113, and an upper side of the figure indicates a larger value than a lower side. Furthermore, a vertical axis on the right side denotes an amount of distortion (unit: ppm) of the semiconductor substrate 111, and an upper side of the figure indicates a larger value than a lower side.

Even though each axis denotes an amount of warpage (unit: micrometer), "O" indicates a flat state, "+" indicates a state of being warped down, and "−" indicates a state of being warped up. In addition, in a manufacturing process of the solid-state imaging device 101, the semiconductor substrate 111 is made thin after the semi-conductor substrate 111 is bonded to the glass substrate 113. Here, a state where thinning is not performed is referred to as "before BG", and a state where the thinning is completed is referred to as "after BG".

Here, a line graph which is made by connecting points of a white square in a straight line indicates a change of the amount of warpage of the substrate before the semi-conductor substrate's 111 is thinned (before BG), after the semiconductor substrate 111 is bonded to the glass substrate 113. That is, the horizontal axis of the figure denotes the amount of warpage of the semiconductor substrate 111, and the vertical axis on the left side of the figure denotes the amount of warpage of the bonded substrate, and thus if the amount of warpage of the semiconductor substrate 111 is increased, the amount of warpage of the bonded substrate is also increased. Thus, by warping the semiconductor substrate 111 towards a "−" side, it is possible to suppress the warpage of the bonded substrate.

In addition, a line graph which is made by connecting points of a black diamond in a straight line indicates a change of the amount of warpage of the substrate after the semiconductor substrate 111 is thinned (after BC), after the semiconductor substrate 111 is bonded to the glass substrate 113. That is, the horizontal axis of the figure denotes the amount of warpage of the semiconductor substrate 111, and the vertical axis on the left side of the figure denotes the amount of warpage of the bonded substrate, and thus if the semiconductor substrate 111 is excessively warped towards the "−" side, the amount of warpage of the bonded substrate is increased.

That is, if only the bonding of the semiconductor substrate 111 and the glass substrate 113 is considered, the semiconductor substrate 111 may be warped towards the "−" side, but if the thinning is considered in addition to the bonding, excessively warping the semiconductor substrate 111 to the "−" side may not be preferred, and thus when the warpage correction film 114 is formed, it is necessary to control a position of an initial warpage of the semiconductor substrate 111 to an optimal position, in consideration of the bonding and the thinning. That is, by perform a compressive stress of an initial warpage, it is possible to suppress the warpage after the semiconductor substrate 111 is bonded to the glass substrate 113, and the warpage after the thinning is performed.

Furthermore, a line graph which is made by connecting points of a white triangle in a straight line indicates a change of an amount of distortion of the semiconductor substrate 111. That is, the vertical axis on the right side of the figure denotes an amount of distortion of the semiconductor substrate 111, as the amount of distortion approaches zero, the distortion is reduced, and thus it is necessary to control a position of an initial warpage of the semiconductor substrate 111 to an optimal position in such a manner that the amount of distortion approaches zero. For example, if, in a state where the position of the initial warpage of the semiconductor substrate 111 of the horizontal axis of the figure is warped to approximately −50 micrometer, the semiconductor substrate 111 is bonded to the glass substrate 113, and it is possible to perform the bonding without receiving the influence of the distortion.

As described above, it is possible not only to suppress the warpage when the semiconductor substrate 111 is bonded to the glass substrate 113, but also to correct the amount of distortion. For example, as illustrated in FIG. 2 described above, when the semiconductor substrate 111 is bonded to the glass substrate 113 via the adhesion layer 112, a phenomenon occurs, in which the semiconductor substrate 111 is pulled to the glass substrate 113 thereby being deformed, but the initial warpage of the semiconductor substrate 111 is suppressed and an amount of distortion is corrected by the warpage correction film 114, and thus it is possible to perform the bonding without receiving the influence of the distortion.

By forming the optimized warpage correction film 114 as described above, it is possible to suppress the warpage of the substrate (bonded substrate) which is formed by bonding the semiconductor substrate 111 to the glass substrate 113 via the adhesion layer 112.

In addition, since the warpage is corrected using the warpage correction film 114, it is possible to thin the thickness of the glass substrate 113. For example, in the solid-state imaging device 101 in FIG. 3, it can be seen as a simulation result that the glass substrate 113 can be reduced to a thickness equal to or less than 1 mm and the adhesion layer 112 and the warpage correction film 114 can be reduced to a thickness equal to 1 micrometer to 100 micrometer.

Then, in the solid-state imaging device 101 in FIG. 3, the thickness of the semiconductor substrate 111 is 50 micrometer to 300 micrometer, and thus it is possible to reduce the thickness of the semiconductor substrate 111, compared to the solid-state imaging device 1 in FIG. 1. As a result, it is possible to suppress the warpage that is generated by bonding substrates, and to meet the requirement of miniaturization. The thickness of the glass substrate 113 may be thin in order to suppress the distortion of the semiconductor substrate 111.

For example, it can be seen as a simulation result that it may be preferable that the thermal expansion coefficient of the semiconductor substrate 111 is 3 ppm/degrees Celsius, the thermal expansion coefficient of the glass substrate 113 is 3 ppm/degrees Celsius to 8 ppm/degrees Celsius, and a value of the thermal expansion coefficient of the warpage correction film 114 is 0.1 ppm/degrees Celsius to 100 ppm/degrees Celsius. In addition, it may be preferable that the thickness of the warpage correction film 114 is thinner. Furthermore, it may be preferable that the adhesion layer 112 does not have stress.

In addition, it is possible to use the glass substrate 113 with the thermal expansion coefficient close to the thermal expansion coefficient of the semiconductor substrate 111, but it is assumed that, by the warpage due to a slight difference between the thermal expansion coefficients, conveyance troubles can occur in a semiconductor process. In contrast to this, in the present technology, the difference between the thermal expansion coefficients caused by the substrate, or the like can be absorbed by the warpage correction film 114, and thus conveyance reliability at the time of semiconductor process is improved.

Furthermore, since the thermal expansion coefficients are changed by a material or a pattern that is formed on a surface of the semiconductor substrate 111, it is assumed that each time, it is difficult to change the thermal expansion coefficient of the glass substrate 113 to be bonded, and thus it is difficult to build a stable bonding process. In contrast to this, in the present technology, since the difference between the thermal expansion coefficients caused by the substrate, or the like can be absorbed by the warpage correction film 114, it is possible to build a stable bonding process.

Furthermore, in addition, the warpage due to a material to be configured or a layout is changed also in the elements that are formed on the surface of the semiconductor substrate 111, but it is difficult to manufacture the glass substrate 113, the thermal expansion coefficient of which is finely controlled, from a viewpoint of cost, and thus it is assumed that it is difficult to apply to multi products. In contrast to this, in the present technology, since the thermal expansion coefficients can be finely controlled by the warpage correction film 114, it is possible to apply to the multi product.

(Another Structure of Bonded Substrate when Warpage Correction is Performed)

Figure 6A:
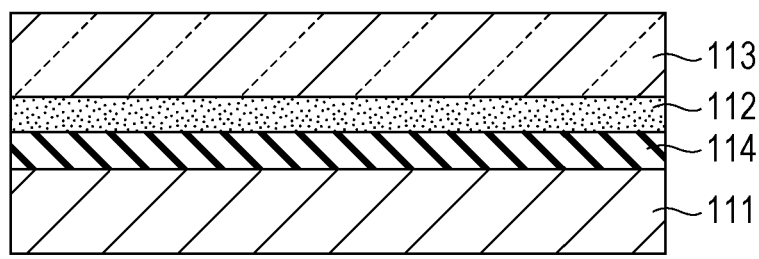
FIGS. 6A-6C are illustrative views showing another structure of the bonded substrate when the warpage correction is performed.
Figure 6B:
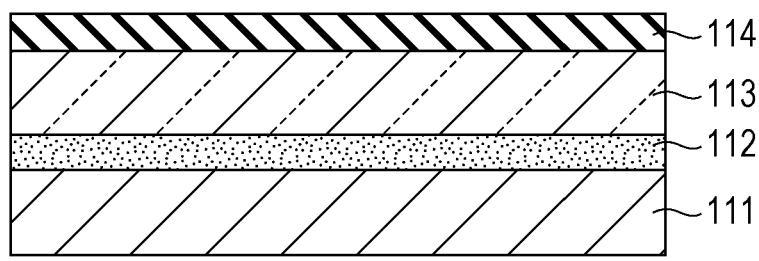
Figure 6C:
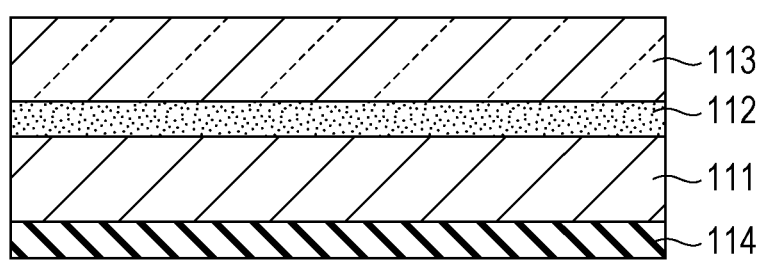

FIGS. 6A-6C are views illustrating another structure of the bonded substrate when the warpage correction to which the present technology is applied is performed.

In the above description, as the solid-state imaging device 101, the bonded substrate (FIG. 3, or the like) is described, which has a structure in which the semiconductor substrate 111, the adhesion layer 112, the warpage correction film 114, and the glass substrate 113 are sequentially stacked from bottom to top, but for example, it is possible to employ other structures, such as the structures illustrated in FIG. 6A to FIG. 6C.

In FIG. 6A, the bonded substrate has a structure in which the semiconductor substrate 111, the warpage correction film 114, the adhesion layer 112, and the glass substrate 113 are sequentially stacked from bottom to top.

In FIG. 6B, the bonded substrate has a structure in which the semiconductor substrate 111, the adhesion layer 112, the glass substrate 113, and the warpage c01 Tection film 114 are sequentially stacked from bottom to top.

In FIG. 6C, the bonded substrate has a structure in which the warpage correction film 114, the semiconductor substrate 111, the adhesion layer 112, and the glass substrate 113 are sequentially stacked from bottom to top.

As described above, in the bonded substrate, the warpage correction film 114 is formed in the surface or the rear surface of the semiconductor substrate 111 or the glass substrate 113, and corrects the warpage that is generated after the substrates are heat-bonded together. In the following description, a case where the solid-state imaging device 101 has a structure in FIG. 6A will be described.

<2. Construction Example of Solid-State Imaging Device>

(Circuit Configuration of Semiconductor Substrate)

Figure 7:
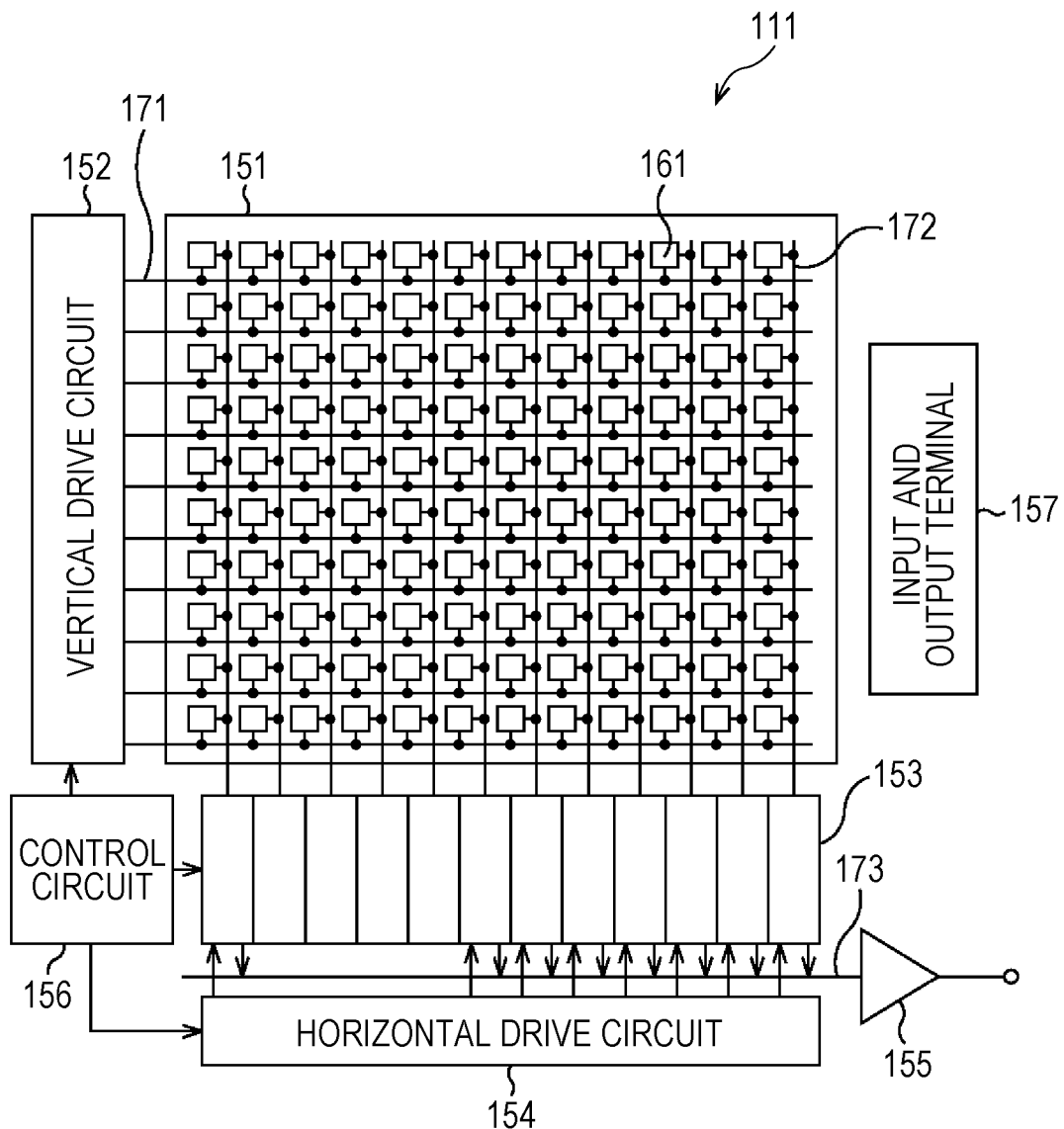
FIG. 7 is an illustrative diagram showing a circuit configuration of a semi-conductor substrate that configures a solid-state imaging device.

FIG. 7 is a diagram illustrating a circuit configuration of a semiconductor substrate 111 that configures the solid-state imaging device 101.

In FIG. 7, the semiconductor substrate 111 is configured to include a pixel array unit 151, a vertical drive circuit 152, column signal processing circuits 153, a horizontal drive circuit 154, an output circuit 155, a control circuit 156, and an input and output terminal 157.

Unit pixels 161 are arranged in a two-dimensional array shape in the pixel array unit 151. The unit pixel 161 is configured to include a photo diode functioning as a photoelectric conversion element, and a plurality of pixel transistors. A circuit configuration example of the unit pixel 161 will be described later with reference to FIG. 8.

The vertical drive circuit 152 is configured with, for example, a shift reregister, selects a predetermined pixel drive wire 171, supplies a pulse for driving the unit pixel 161 to the selected pixel drive wire 171, and drives the unit pixels 161 by a row unit. That is, the vertical drive circuit 152 selectively and sequentially scans each unit pixel 161 of the pixel array unit 151 by a row unit in a vertical direction, and supplies a pixel signal based on signal charges that are generated according to an amount of received light in the photoelectric conversion element of each unit pixel 161 to the column signal processing circuit 153 via the vertical signal line 172.

The column signal processing circuits 153 are arranged in each column of the unit pixels 161, and perform signal processing such as noise removal of a signal that is output from the unit pixels 161 of one row, in each pixel column. For example, the column signal processing circuit 153 performs the signal processing, such as correlated double sampling (CDS) for removing pixel-specific fixed pattern noise, or analog digital (AD) conversion.

The horizontal drive circuit 154 is configured with, for example, shift registers, sequentially selects each of the column signal processing circuits 153 by sequentially outputting horizontal scan pulses, and outputs pixel signals from each of the column signal processing circuits 153 to horizontal signal lines 173.

The output circuit 155 performs signal processing with respect to the signals that are sequentially supplied from each of the column signal processing circuits 153 via the horizontal signal line 173, and outputs the signal. There is a case where the output circuit 155 performs only, for example, buffering, and there is a case where the output circuit 155 performs a black level adjustment, a column variation correction, various digital signal processing, or the like.

The control circuit 156 receives an input clock signal, and data that commands an operation mode, or the like, and outputs data such as internal information, or the like of the semiconductor substrate 111. That is, the control circuit 156 generates a clock signal or a control signal that is a reference of operations of the vertical drive circuit 152, the column signal processing circuit 153, the horizontal drive circuit 154, and the like, based on a vertical synchronization signal, a horizontal synchronization signal, and a master clock signal. Then, the control circuit 156 outputs the clock signal or the control signal that is generated to the vertical drive circuit 152, the column signal processing circuit 153, the horizontal drive circuit 154, and the like.

The input and output terminal 157 exchanges signals with an external device.

The semiconductor substrate 111, which is configured as described above, in FIG. 7 is a complementary metal oxide semiconductor (CMOS) image sensor, that is called a column AD method, and in which the column signal processing circuits 153 that perform CDS processing and AD conversion are arranged in each pixel column.

(Circuit Configuration Example of Unit Pixel)

Figure 8:
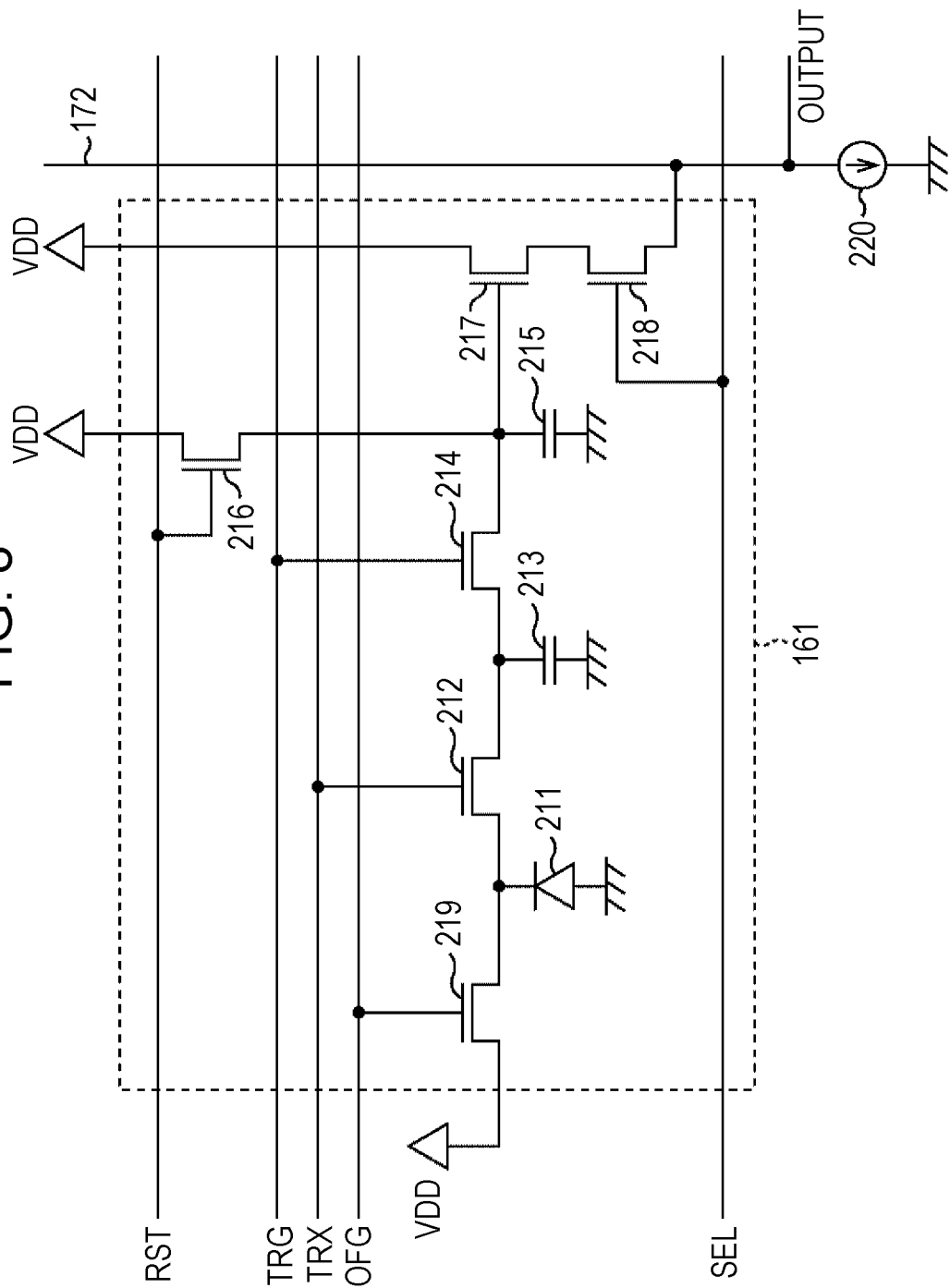
FIG. 8 is an illustrative diagram showing an equivalent circuit of a unit pixel in FIG. 7.

FIG. 8 illustrates an equivalent circuit of the unit pixel 161 in FIG. 7.

The unit pixel 161 in FIG. 8 illustrates a configuration for realizing a global shutter function of electronic type.

In FIG. 8, the unit pixel 161 includes a photo diode 211, a first transfer transistor 212, a memory unit (MEM) 213, a second transfer transistor 214, an FD (floating diffusion area) 215, a reset transistor 216, an amplification transistor 217, a selection transistor 218, and a non-output transistor 219.

The photo diode 211 is a photoelectric conversion element that generates charges (signal charges) according to an amount of received light, and stores the charges. An anode terminal of the photo diode 211 is grounded, and a cathode terminal thereof is connected to the memory unit 213 via the first transfer transistor 212. In addition, the cathode terminal of the photo diode 211 is also connected to a discharging transistor 219 that discharges unnecessary charges.

When being turned on by a transfer signal TRX, the first transfer transistor 212 reads the charges that are generated by the photo diode 211, and transfers the charges to the memory unit 213. The memory unit 213 is a charge retention unit that temporarily retains the charges, while the charges are transferred to the FD 215.

When being turned on by the transfer signal TRG, the second transfer transistor 214 reads the charges that are retained in the memory unit 213, and transfers the charges to the FD 215.

The FD 215 is a charge retention unit that retains the charges that are read from the memory unit 213 so as to be read as a signal. When the reset transistor 216 is turned on by a reset signal RST, the charges that are stored in the FD 215 are discharged to a constant voltage source VDD, and thus a potential of the FD 215 is reset.

The amplification transistor 217 outputs a pixel signal according to the potential of the FD 215. That is, the amplification transistor 217 and a load MOS 220 as a constant current source configure a source follower circuit, and a pixel signal indicating a level according to the charges that are stored in the FD 215 is output from the amplification transistor 217 to the column signal processing circuit 153 (FIG. 7) via the selection transistor 218. The load MOS 220 is disposed inside, for example, the column signal processing circuit 153.

The selection transistor 218 is turned on when the unit pixel 161 is selected by a selection signal SEL, and outputs the pixel signal of the unit pixel 161 to the column signal processing circuit 153 via the vertical signal line 172.

When being turned on by a discharging signal OFG, the discharging transistor 219 discharges unnecessary charges that are stored in the photo diode 211 to the constant voltage source VDD.

The transfer signal TRX, the transfer signal TRG, the reset signal RST, the discharging signal OFG, and the selection signal SEL are supplied from the vertical drive circuit 152 via the pixel drive wire 171.

Next, an operation of the unit pixel 161 in FIG. 8 will be simply described.

To begin with, before exposure is started, the discharging signal OFG with a High level is supplied to the discharging transistor 219, and thereby the discharging transistor 219 is turned on, the charges that are stored in the photo diode 211 are discharged into the constant voltage source VDD, and the photo diodes 211 of all the pixels are reset.

After the photo diode 211 is reset, if the discharging transistor 219 is turned off by the discharging signal OFG with a Low level, the exposure is started in all pixels of the pixel array unit 151.

If a predetermined exposure time that is determined in advance passes, the first transfer transistor 212 is turned on by the transfer signal TRX, and the charges that are stored in the photo diode 211 are transferred to the memory unit 213, in all pixels of the pixel array unit 151.

After the first transfer transistor 212 is turned off, the charges that are retained in the memory units 213 of each unit pixel 161 are sequentially read to the column signal processing circuits 153 by a row unit. In a reading operation, the second transfer transistor 214 of the unit pixel 161 in a reading row is turned on by the transfer signal TRG, and the charges that are retained in the memory unit 213 are transferred to the FD 215.

Then, the selection transistor 218 is turned on by the selection signal SEL, and thus a signal indicating a level according to the charges that are stored in the FD 215 is output from the amplification transistor 217 to the column signal processing circuit 153 via the selection transistor 218.

As described above, the unit pixel 161 having the pixel circuit in FIG. 8 equally sets the exposure time in all pixels of the pixel array unit 151, temporarily retains the charges in the memory unit 213 after the exposure is ended, and can perform an operation (imaging) of a global shutter method for sequentially reading the charges from the memory unit 213 by a row unit.

The circuit configuration of the unit pixel 161 is not limited to the configuration illustrated in FIG. 8, and for example, can employ a circuit configuration for performing an operation of a so-called rolling shutter method, without the memory unit 213.

(Detailed Structure of Solid-State Imaging Device)

Figure 9:
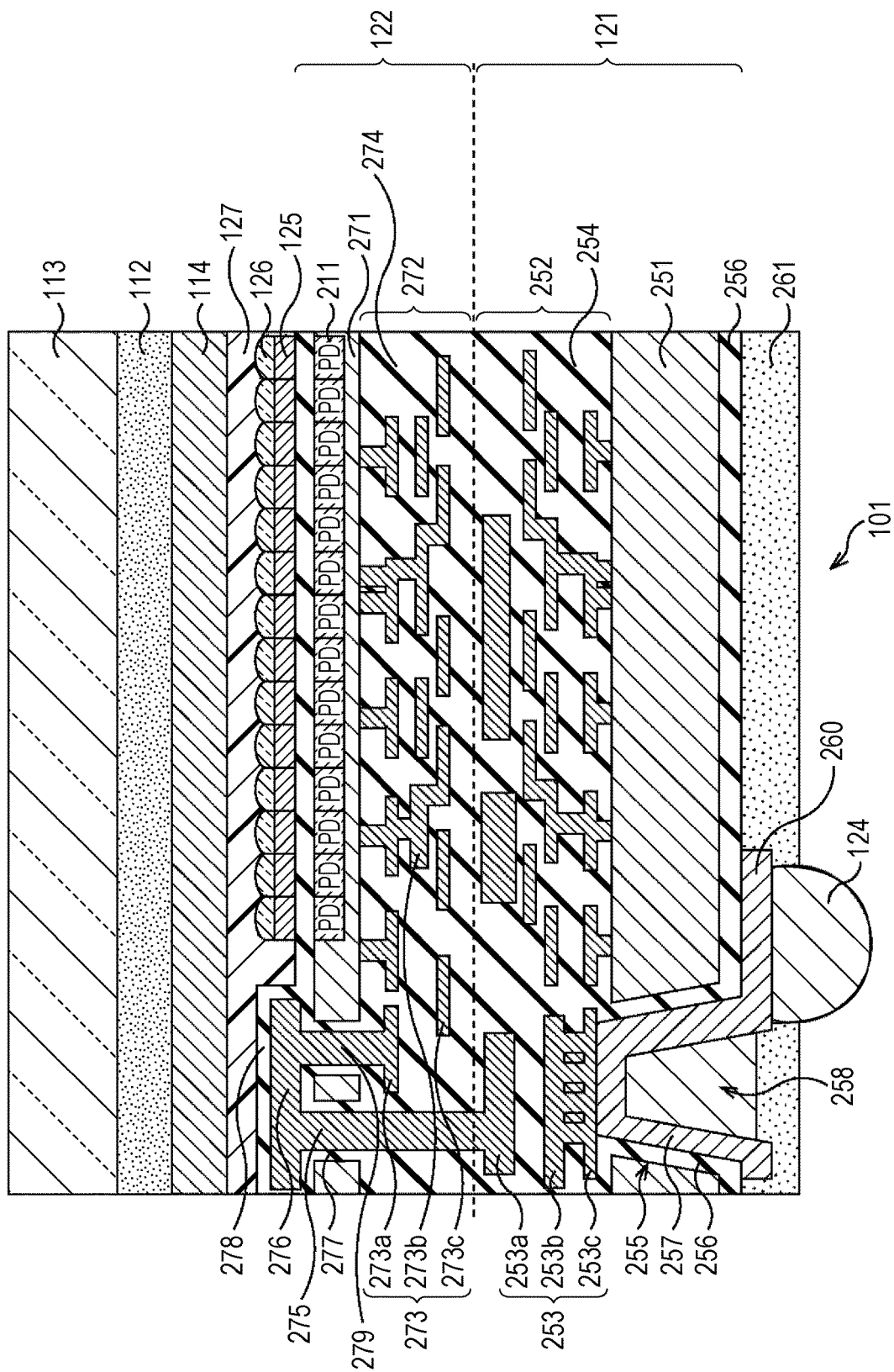
FIG. 9 is an illustrative view showing a detailed structure of a solid-state imaging device.

Next, a detailed structure of the solid-state imaging device 101 will be described with reference to FIG. 9. FIG. 9 is a cross-sectional view illustrating an enlarged portion of the solid-state imaging device 101.

In FIG. 9, the semiconductor substrate 111 is configured by stacking a lower side substrate 121 and an upper side substrate 122. In the lower side substrate 121, a plurality of solder balls 124 that is rear surface electrodes to be electrically connected to an external substrate which is not illustrated, is formed.

On an upper surface of the upper side substrate 122, color filters 125 of red (R), green (G), or blue (B), and on-chip lenses 126 are formed. In addition, the upper side substrate 122 is connected to a cavity-less structure via the glass substrate 113, the adhesion layer 112, the warpage correction film 114, and a transparent resin layer 127.

On the lower side substrate 121, a multi-layer wiring layer 252 is formed on an upper side (upper side substrate 122 side) of a silicon substrate 251 that is configured by silicon (Si). For example, a control circuit or a logic circuit is configured by the multilayer wiring layer 252.

The multi-layer wiring layer 252 is configured with a plurality of wiring layers 253 that is configured by a top wiring layer 253a which is closest to the upper side substrate 122, an intermediate wiring layer 253b, and a bottom wiring layer 253c which is closest to the silicon substrate 251, and an interlayer insulating film 254 that is formed between each wiring layers 253.

The plurality of wiring layers 253 is formed using, for example, copper (Cu), aluminum (Al), tungsten (W), or the like, and the interlayer insulating film 254 is formed by, for example, an SiO2 film, an SiN film, or the like. Each of the plurality of wiring layers 253 and the interlayer insulating film 254 may be formed by the same material, and two or more of those may be properly used depending on the layer.

A silicon through-hole 255 that passes through the silicon substrate 251 is formed in a predetermined position of the silicon substrate 251, a connection conductor 257 is filled with in an inner wall of the silicon through-hole 255 via an insulating film 256, and thereby a through silicon via (TSV) 258 is formed. The insulating film 256 can be formed by, for example, an SiO2 film, an SiN film, or the like.

In the through silicon via 258 illustrated in FIG. 9, the insulating film 256 and the connection conductor 257 are formed along an inner wall surface, and the inside of the silicon through-hole 255 is hollowed, but depending on an inner diameter, the whole inside of the silicon through-hole 255 is filled with the connection conductor 257. In other words, even though the inside of the through-hole is filled with the conductor, a portion of that may be hollowed. The same is also applied to a through chip via (TCV) 275, or the like that will be described later.

The connection conductor 257 of the through silicon via 258 is connected to a redistribution wire 260 that is formed on a lower surface side of the silicon substrate 251, and the redistribution wire 260 is connected to the solder ball 124. The connection conductor 257 and the redistribution wire 260 can be formed by, for example, copper (Cu), tungsten (W), polysilicon, or the like.

In addition, a solder mask (solder resist) 261 is formed on the lower surface side of the silicon substrate 251 so as to cover the redistribution wire 260 and the insulating film 256, except for an area in which the solder ball 124 is formed.

Meanwhile, in the upper side substrate 122, a multi-layer wiring layer 272 is formed on a lower side (lower side substrate 121 side) of the silicon substrate 271 that is formed with silicon (Si). For example, a pixel circuit of a pixel area is configured by the multi-layer wiring layer 272.

The multi-layer wiring layer 272 is configured with a plurality of wiring layers 273 that is configured by a top wiring layer 273a which is closest to the silicon substrate 271, an intermediate wiring layer 273b, and a bottom wiring layer 273c which is closest to the lower side substrate 121, and an interlayer insulating film 274 that is formed between each wiring layers 273.

As a material that is used for the plurality of wiring layer 273 and the interlayer insulating film 274, the same material as that of the wiring layer 253 and the interlayer insulating film 254 that are described above can be employed. In addition, in the same manner as the wiring layer 253 and the interlayer insulating film 254 that are describe above, the plurality of wiring layer 273 and the interlayer insulating film 274 may be formed by properly using one or two or more materials.

In the example of FIG. 9, the multi-layer wiring layer 272 of the upper side substrate 122 is configured by the wiring layer 273 with three layers, and the multi-layer wiring layer 252 of the lower side substrate 121 is configured by the wiring layer 253 with four layers, but the total number of the wiring layers are not limited to this, and the wiring layers can be formed with an arbitrary number of layers.

Inside the silicon substrate 271, the photo diodes 211 that are formed by PN junction are formed in each unit pixel 161, In addition, it is not illustrated, but in the multi-layer wiring layer 272 and the silicon substrate 271, a plurality of pixel transistors such as the first transfer transistor 212 or the second transfer transistor 214, the memory unit 213, or the like is formed.

In a predetermined position of the silicon substrate 271 in which the color filter 125 and the on-chip lens 126 are not formed, the through silicon via 279 that is connected to the wiring layer 273a of the upper side substrate 122, and the through chip via 275 that is connected to the wiring layer 253a of the lower side substrate 121 are formed.

The through chip via 275 and the through silicon via 279 are connected to the wire 276 for connection that is formed on an upper surface of the silicon substrate 271. In addition, the insulating film 277 is formed between each of the through silicon via 279 and the through chip via 275, and the silicon substrate 271. Furthermore, on the upper surface of the silicon substrate 271, the color filters 125 and the on-chip lenses 126 are formed via a planarizing film (insulating film) 278.

As described above, the semiconductor substrate 111 of the solid-state imaging device 101 illustrated in FIG. 9 is configured by a stacking structure which is formed by bonding the multi-layer wiring layer 272 side of the lower side substrate 121 to the multi-layer wiring layer 252 side of the upper side substrate 122. In FIG. 9, a surface in which the multi-layer wiring layer 272 side of the lower side substrate 121 is bonded to the multilayer wiring layer 252 side of the upper side substrate 122 is denoted by a dashed line.

In addition, in the solid-state imaging device 101, the color filters 125 and the on-chip lenses 126 are formed over the upper surface of the upper side substrate 122, and the transparent resin layer 127 having a planarized surface is formed on the on-chip lenses 126. Here, since a refractive index of the on-chip lens 126 is approximately 2.0, and a refractive index of an organic material, or the like that configures the transparent resin layer 127 is approximately 1.4, it is possible to secure a light condensing per-formance of the on-chip lens 126 in the solid-state imaging device 101.

Furthermore, the upper side substrate 122 is connected to the cavity-less structure via the glass substrate 113, the adhesion layer 112, the warpage correction film 114, and the transparent resin layer 127. Here, a refractive index of the glass substrate 113 and the adhesion layer 112 is approximately 1.5, and a refractive index of the warpage correction film 114 is approximately 1.4 to 1.5. That is, the refractive index (approximately 1.4 to 1.5) of the warpage correction film 114 is a value between the refractive index (approximately 1.4) of the transparent resin layer 127 that is the outermost surface film on the semiconductor substrate, and the refractive index (approximately 1.5) of the adhesion layer 112, and since a difference between the re-fractive indexes of each layer is small, it is possible to prevent reflection of light.

<3. Manufacturing Method of Solid-State Imaging Device>

Next, a manufacturing method of the solid-state imaging device 101 having the structure in FIG. 9 will be described with reference to FIGS. 10A-10D. FIGS. 10A-10D illustrate only a structure of upper layers over the color filters 125 and the on-chip lenses 126 that are formed on the upper surface of the upper side substrate 122, and does not illustrate the other configurations.

First, the lower side substrate 121 and the upper side substrate 122 that are in a semifinished product state are separately manufactured. In the lower side substrate 121, the multi-layer wiring layers 252 are formed in areas which become each chip portion of the silicon substrate (silicon wafer) 251. Meanwhile, in the upper side substrate 122, the photo diodes 211 or source regions and drain regions of the pixel transistors of each unit pixel 161 are formed in areas that become each chip portion of the silicon substrate (silicon wafer) 271. In addition, the multi-layer wiring layer 272 is formed on one surface of the silicon substrate 271, and the color filters 125 and the on-chip lenses 126 are formed on the other surface.

Figure 10A:
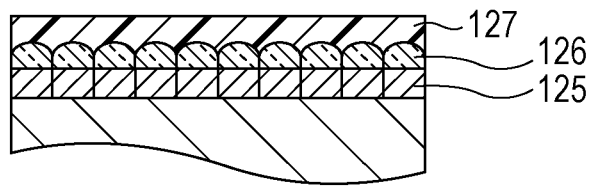
FIGS. 10A-10D are illustrative views showing a manufacturing method of a solid-state imaging device having the structure in FIG. 9.

Then, the multi-layer wiring layer 272 side of the lower side substrate 121 and the multi-layer wiring layer 252 side of the upper side substrate 122 that are manufactured are bonded together so as to face each other. In addition, as illustrated in FIG. 10A, the entire surface of the upper side substrate 122, which is bonded to the lower side substrate 121 and on which the on-chip lenses 126 are formed, is coated with the transparent resin layer 127.

Figure 10B:
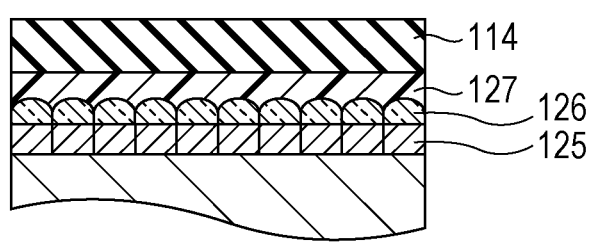

Next, as illustrated in FIG. 10B, the warpage correction film 114 that can correct the warpage which is generated when the semiconductor 111 and the glass substrate 113 are bonded together is formed on the transparent resin layer 127. It may be preferable that the warpage correction film 114 is transparent, can control stress, and is a film which is formed by P-CVD with wide film thickness control range. In addition, since the warpage is determined by the film thickness and the stress that the film itself has, optimal conditions are calculated from the film stress and the film thickness, in consideration of the warpage of the semiconductor substrate 111 and thermal expansion thereof, and the warpage of the glass substrate 113 and thermal expansion thereof.

In addition, as the film species of the warpage correction film 114, for example, an SiO2 film, a TEOS film, an SiN film, an SiCO film, an SiCN film, an SiC film, or the like can be used, but when considering reflection of light generated in a film interface with a refractive index difference, it may be preferable that the refractive index of the warpage correction film is set to a refractive index (approximately 1.4 to 1.5) between the refractive index (approximately 1.4) of the transparent resin layer 127 and the re-fractive index (approximately 1.5) of the adhesion layer 112 for being bonded to the glass substrate 113. In addition, here, an example in which P-CVD is used is described, but as a transparent film with stress, an SOG or an organic film (for example, acrylic or epoxy) that is formed by coating may be used, regardless of a manufacturing method or film species.

Figure 10C:
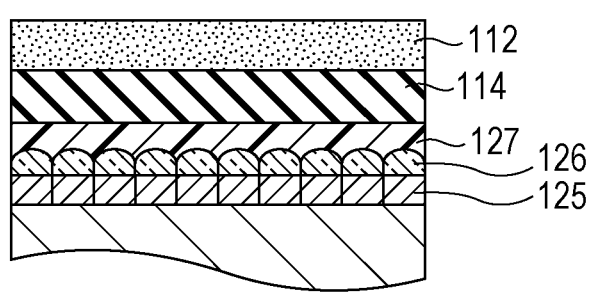
Figure 10D:
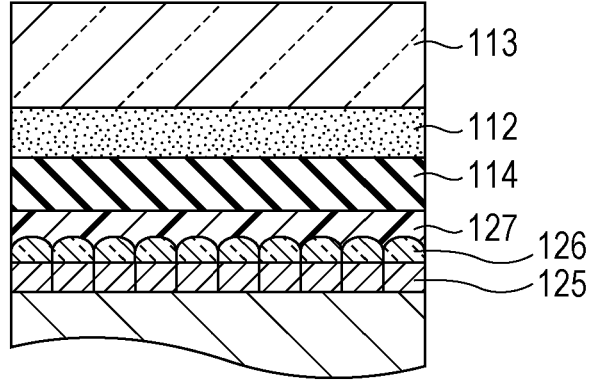

Next, as illustrated in FIG. 10C, the adhesion layer 112 for being bonded to the glass substrate 113 is formed on the warpage correction film 114, Then, as illustrated in FIG. 10D, the glass substrate 113 is bonded by the adhesion layer 112. In the manufacturing process of the solid-state imaging device 101, the semiconductor substrate 111 and the glass substrate 113 are bonded together and thereafter a process of thinning the semiconductor substrate 111 is performed, but here, for simplification, description thereof will be omitted.

In FIG. 10, a case where the solid-state imaging device 101 has the structure in FIG. 6A is described as the manufacturing method of the solid-state imaging device 101, but instead of the structure in FIG. 6A, even when the structure in FIG. 3 or the structures in FIG. 6B to FIG. 6C are employed, each layer is formed in the order of being stacked in the same manner as described above.

The solid-state imaging device 101 in FIG. 9 can be manufactured by the manufacturing method described above.

<4. Configuration of Imaging Apparatus>

The present technology is not limited to application to a solid-state imaging device.

That is, the present technology can be applied to all electronic apparatuses that use solid-state imaging devices for image capturing units (photoelectric conversion elements), such as an imaging apparatus such as a digital still camera or a video camera, a portable terminal device with an imaging function, or a copy machine that uses a solid-state imaging device for an image capturing unit.

Figure 11:
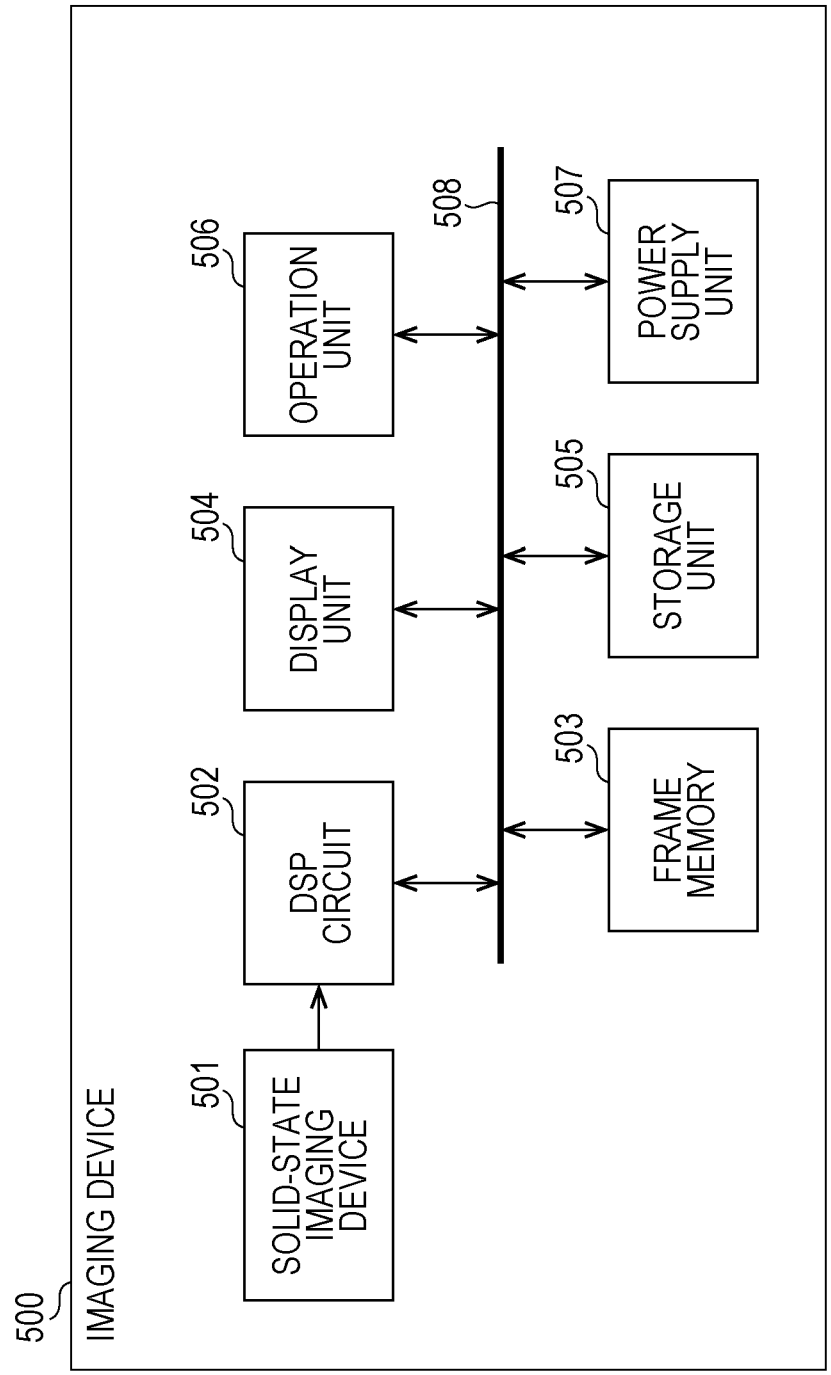
FIG. 11 is an illustrative diagram showing a configuration example of an imaging apparatus.

FIG. 11 is a block diagram illustrating a configuration example of an imaging apparatus as an electronic apparatus.

An imaging apparatus 500 in FIG. 11 includes a solid-state imaging device 501 to which the structure of the solid-state imaging device 101 in FIG. 9 is employed, and a digital signal processor (DSP) circuit 502 that is a camera signal processing circuit. The imaging apparatus 500 also includes a frame memory 503, a display unit 504, a storage unit 505, an operation unit 506, and a power supply unit 507. The DSP circuit 502, the frame memory 503, the display unit 504, the storage unit 505, the operation unit 506, and the power supply unit 507 are connected to each other via a bus line 508.

The solid-state imaging device 501 converts an amount of incident light that is formed on a imaging surface by capturing the incident light (image light) from a subject into an electric signal by a pixel unit, and outputs the electric signal as a pixel signal. As the solid-state imaging device 501, the solid-state imaging device 101 in FIG. 9, that is, a semiconductor package which is miniaturized by stacking the upper side substrate 122 including a pixel area on the lower side substrate 121 including at least a logic circuit, can be used.

The display unit 504 is configured by a panel type display device, such as a liquid crystal panel or an organic electro luminescence (EL) panel, and displays a moving image or a still image that is imaged by the solid-state imaging device 501. The storage unit 505 stores the moving image or the still image that is imaged by the solid-state imaging device 501 in a storage medium, such as a hard disc or a semiconductor memory.

The operation unit 506 emits an operation command with regard to various functions that the imaging apparatus 500 has, according to an operation performed by a user. The power supply unit 507 properly supplies various power supplies that are operational power supplies of the DSP circuit 502, the frame memory 503, the display unit 504, the storage unit 505, and the operation unit 506, to the supply targets.

In the example described above, as an example of a semiconductor device in which the semiconductor substrate 111 that is configured by stacking the upper side substrate 122 on the lower side substrate 121 is packaged, the configuration of the CMOS solid-state imaging device is described, but the present technology is not limited to a solid-state imaging device, and can be applied to a semiconductor device that is packaged as other usage.

For example, the present technology is not limited to application to a solid-state imaging device that detects distribution of an amount of incident light of visible light and images as an image, and can be applied to all the solid-state imaging devices (physical amount distribution detecting device), such as a solid-state imaging device that images distribution of incident quantity of an infrared light, an X-ray, particles, or the like as an image, or fingerprint detection sensor that detects distribution of another physical quantity such as pressure or capacitance as a broad meaning, and images the detected distribution as an image.

The embodiments of the present technology are not limited to the above-described embodiments, but various changes can be made without departing from the gist of the present technology. For example, forms in which entire or parts of the above-described plural embodiments are combined can be applied.

The effects described in the present specification are simply illustrative, and are not intended to limit the present technology. There may be effects other than those described herein.

In addition, the present technology can take the following configurations.

(1)

A solid-state imaging device, including: a semiconductor substrate; a glass substrate; an adhesion layer provided between the semiconductor substrate and, the glass substrate; and a warpage correction film provided adjacent to one of the semiconductor substrate and the glass substrate.

(2)

The solid-state imaging device according to (1), where the warpage correction film is provided between the adhesion layer and the glass substrate.

(3)

The solid-state imaging device according to any one of (1) to (2), where the warpage correction film is provided between the adhesion layer and the semiconductor substrate.

(4)

The solid-state imaging device according to any one of (1) to (3), where the warpage correction film is provided on a side of the glass substrate opposite from the adhesion layer.

(5)

The solid-state imaging device according to any one of (1) to (4), where the warpage correction film is provided on a side of the semiconductor substrate opposite from the adhesion layer.

(6)

The solid-state imaging device according to any one of (1) to (6), where the warpage correction film is one of an $SiO_2$ film, a TEOS film, an SiN film, an SiCO film, an SiCN film, and an SiC film.

(7)

The solid-state imaging device according to any one of (1) to (6), further including a transparent resin layer provided between the semiconductor substrate and the warpage correction film, where a refractive index of the warpage correction film is between a refractive index of the transparent resin layer and a refractive index of the adhesion layer.

(8)

The solid-state imaging device according to any one of (1) to (7), where a refractive index of the warpage correction film is from approximately 1.4 to approximately 1.5.

(9)

The solid-state imaging device according to any one of (1) to (8), where the glass substrate has a thickness equal to or less than 1 mm.

(10)

The solid-state imaging device according to any one of (1) to (9), where the semiconductor substrate has a thickness of between approximately 50 micrometers and approximately 300 micrometers.

(11)

The solid-state imaging device according to any one of (1) to (10), where the semiconductor substrate has a thickness of between approximately 50 micrometers and approximately 300 micrometers.

(12)

The solid-state imaging device according to any one of (1) to (12), where the adhesion layer and the warpage correction film have a total thickness of between approximately 1 micrometer and approximately 100 micrometers, (13)

The solid-state imaging device according to any one of (1) to (12), where the adhesion layer and the warpage correction film have a total thickness of between approximately 1 micrometer and approximately 100 micrometers.

(14)

The solid-state imaging device according to any one of (1) to (13), where a thermal expansion coefficient of the semiconductor substrate is approximately 3 ppm/degrees Celsius, a thermal expansion coefficient of the glass substrate is between approximately 3 ppm/degrees Celsius to approximately 8 ppm/degrees Celsius, and a thermal expansion coefficient of the warpage correction film is between approximately 0.1 ppm/degrees Celsius to approximately 100 ppm/degrees Celsius.

(15)

The solid-state imaging device according to any one of (1) to (15), where the adhesion layer is devoid of stress.

(16)

A method of manufacturing a solid-state imaging device, including: bonding a semiconductor substrate to a glass substrate, where an adhesion layer is provided between the semiconductor substrate and the glass substrate, and where a warpage correction film is provided adjacent to one of the semiconductor substrate and the glass substrate.

(17)

The method according to (16), where the bonding is a heat treatment.

(18)

The method according to any one of (16) to (17), further including: after the bonding, thinning the semiconductor substrate.

(19)

The method according to any one of (16) to (18), further including: inducing an initial compressive stress in the warpage correction film, where the warpage correction film is positioned to account for the initial compressive stress in combination with the bonding and the thinning.

(20)

A solid-state imaging device including: a transparent insulating substrate; a semiconductor substrate in which a pixel area having pixel units that perform a photoelectric conversion and are two-dimensionally arranged is formed; and a warpage correction film that is provided to correct warpage of a substrate which is configured by bonding the transparent insulating substrate to the semiconductor substrate via an adhesion layer.

(21)

The solid-state imaging device described in (20), in which on on-chip lenses in the pixel area of the semiconductor substrate, a transparent resin layer with a smaller refractive index than that of the on-chip lens is formed.

(22)

The solid-state imaging device described, in (21), in which the semiconductor substrate, the warpage correction film, the adhesion layer, and the transparent insulating substrate are sequentially stacked, and a refractive index of the warpage correction film is set to a value between a refractive index of an outermost surface film on the semiconductor substrate and a refractive index of the adhesion layer.

(23)

The solid-state imaging device described in any one of (20) to (22), in which the warpage correction film is formed as a film in which at least one of a thermal expansion coefficient and stress, with regard to the transparent insulating substrate, the semiconductor substrate, and the adhesion layer.

(24)

The solid-state imaging device described in any one of (20) to (23), in which the warpage correction film is a transparent film.

(25)

The solid-state imaging device described in (20), in which the warpage correction film is formed on a surface or a rear surface of the semiconductor substrate or the transparent insulating substrate.

(26))

A manufacturing method of a solid-state imaging device, the method including: forming a warpage correction film that is provided to correct warpage of a substrate which is configured by bonding a transparent insulating substrate to a semiconductor substrate via an adhesion layer, on a surface or a rear surface of the transparent insulating substrate, or the semiconductor substrate in which a pixel area having pixel units that perform a photoelectric conversion and are two-dimensionally arranged is formed; and bonding the transparent insulating substrate to the semiconductor substrate via the adhesion layer.

(27)

An imaging apparatus including: a solid-state imaging device that is configured by stacking a transparent insulating substrate, a semiconductor substrate in which a pixel area having pixel units that perform a photoelectric conversion and are two-dimensionally arranged is formed, and a warpage correction film that is provided to correct warpage of a substrate which is configured by bonding the transparent insulating substrate to the semiconductor substrate via an adhesion layer.

REFERENCE SIGNS LIST

101 Solid-state imaging device
111 Semiconductor substrate
112 Adhesion layer
113 Glass substrate
114 Warpage correction film
125 Color filter
126 On-chip lens
127 Transparent resin layer
151 Pixel array unit
161 Unit pixel
500 Imaging apparatus
501 Solid-state imaging device

What is claimed is:

1. A package, comprising:
a first substrate including a plurality of photoelectric conversion elements;
a glass substrate;
an adhesion layer between the first substrate and the glass substrate;
a warpage correction film between the adhesion layer and the first substrate; and
a transparent resin layer between the first substrate and the warpage correction film, wherein a refractive index of the warpage correction film is between a refractive index of the transparent resin layer and a refractive index of the adhesion layer.

2. The package of claim 1, wherein the warpage correction film is an organic film.

3. The package of claim 1, wherein the warpage correction film is one of an acrylic film and an epoxy film.

4. The package of claim 1, wherein the warpage correction film is one of an $SiO_2$ film, a TEOS film, an SiN film, an SiCO film, an SiCN film, and an SiC film.

5. The package of claim 1, wherein a second substrate including a logic circuitry is bonded to the first substrate.

6. The package of claim 5, wherein
the first substrate includes a first semiconductor substrate and a first wiring layer,
the second substrate includes a second semiconductor substrate and a second wiring layer, and
the first wiring layer and the second wiring layer are between the first semiconductor substrate and the second semiconductor substrate.

7. The package of claim 6, wherein
the first wiring layer is made of Cu, Al or, and
the second wiring layer is made of Cu, Al or W.

8. The package of claim 6, wherein the second substrate includes a through silicon via having an insulating layer and a connection conductor.

9. The package of claim 8, wherein the through silicon via is electrically connected to a solder bump via a redistribution wire.

10. The package of claim 1, wherein an edge of the glass substrate is coincident with an outer edge of the package.

11. The package of claim 1, wherein the package is a chip size package.

12. The package of claim 1, wherein the package is a cavity-less structure.

13. The package of claim 11, wherein on-chip lenses are between the transparent resin layer and color filters.

14. The package of claim 1, wherein the refractive index of the warpage correction film is from approximately 1.4 to approximately 1.5.

15. The package of claim 1, wherein the glass substrate has a thickness equal to or less than 1 mm.

16. The package of claim 1, wherein the semiconductor substrate has a thickness of between approximately 50 micrometers and approximately 300 micrometers.

17. The package of claim 9, wherein the semiconductor substrate has a thickness of between approximately 50 micrometers and approximately 300 micrometers.

18. The package of claim 1, wherein the adhesion layer and the warpage correction film have a total thickness of between approximately 1 micrometer and approximately 100 micrometers.

19. The package of claim 11, wherein the adhesion layer and the warpage correction film have a total thickness of between approximately 1 micrometer and approximately 100 micrometers.

20. The package of claim 1, wherein a thermal expansion coefficient of the first substrate is approximately 3 ppm/degrees Celsius, a thermal expansion coefficient of the glass substrate is between approximately 3 ppm/degrees Celsius and approximately 8 ppm/degrees Celsius, and a thermal expansion coefficient of the warpage correction film is between approximately 0.1 ppm/degrees Celsius and approximately 100 ppm/degrees Celsius.

* * * * *